(12) United States Patent
Diewald et al.

(10) Patent No.: US 10,613,124 B2
(45) Date of Patent: Apr. 7, 2020

(54) ELECTRONIC DEVICE AND METHOD FOR TRACKING ENERGY CONSUMPTION

(71) Applicant: Texas Instruments Incorporated, Dallas, TX (US)

(72) Inventors: Horst Diewald, Freising (DE); Johann Zipperer, Garching (DE); Peter Weber, Allershausen (DE); Anton Brauchle, Mering (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/402,370

(22) Filed: May 3, 2019

(65) Prior Publication Data

US 2019/0257863 A1 Aug. 22, 2019

Related U.S. Application Data

(63) Continuation of application No. 14/868,130, filed on Sep. 28, 2015, now Pat. No. 10,324,116, which is a
(Continued)

(51) Int. Cl.
*G01R 21/00* (2006.01)
*G06F 1/28* (2006.01)
(Continued)

(52) U.S. Cl.
CPC ............ *G01R 21/00* (2013.01); *G01R 21/007* (2013.01); *G06F 1/26* (2013.01); *G06F 1/28* (2013.01); *G01R 22/10* (2013.01)

(58) Field of Classification Search
CPC ...... G01R 21/00; G01R 21/007; G01R 21/10; G06F 1/28; G06F 1/26
See application file for complete search history.

(56) References Cited

U.S. PATENT DOCUMENTS

| 5,777,904 A | 7/1998 | Schneider |
| 6,844,739 B2 * | 1/2005 | Kasai ........................ G05F 1/67 323/284 |

(Continued)

FOREIGN PATENT DOCUMENTS

| RU | 2467376 C1 | 11/2012 |
| SU | 330537 A | 2/1972 |
| SU | 1493990 A1 | 7/1989 |

OTHER PUBLICATIONS

Romash E.M. Istochniki vtorichnogo elektropitaniya radioelektronnoi apparatury, Moskva, "Radio i svyaz", 1981, p. p. 118, 119, 124, drwing 7.7a.
(Continued)

*Primary Examiner* — Dominic E Hawkins
(74) *Attorney, Agent, or Firm* — Ebby Abraham; Charles A. Brill; Frank D. Cimino

(57) ABSTRACT

The invention relates to an apparatus and method for tracking energy consumption. An energy tracking system comprises at least one switching element, at least one inductor and a control block to keep the output voltage at a preselected level. The switching elements are configured to apply the source of energy to the inductors. The control block compares the output voltage of the energy tracking system to a reference value and controls the switching of the switched elements in order to transfer energy for the primary voltage into a secondary voltage at the output of the energy tracking system. The electronic device further comprises an ON-time and OFF-time generator and an accumulator wherein the control block is coupled to receive a signal from the ON-time and OFF-time generator and generates switching signals for the at least one switching element in the form of ON-time pulses with a constant ON-time.

9 Claims, 4 Drawing Sheets

Related U.S. Application Data continuation of application No. 13/788,941, filed on Mar. 7, 2013, now Pat. No. 9,146,263.

(51) Int. Cl.
  *G06F 1/26* (2006.01)
  *G01R 22/10* (2006.01)

(56) References Cited

U.S. PATENT DOCUMENTS

| | | | |
|---|---|---|---|
| 7,119,525 | B1 | 10/2006 | Yoshimo |
| 8,076,797 | B2 | 12/2011 | Kramer et al. |
| 8,390,261 | B2 * | 3/2013 | Deboy ............... G05F 1/67 323/222 |
| 8,461,508 | B2 * | 6/2013 | Seymour ............ H01L 31/0504 136/244 |
| 2002/0163323 | A1 | 11/2002 | Kasai et al. |
| 2005/0125703 | A1 | 1/2005 | Lefurgy et al. |
| 2007/0290668 | A1 | 12/2007 | Chou et al. |
| 2008/0141998 | A1 | 6/2008 | Sun |
| 2008/0157849 | A1 | 7/2008 | Ito |
| 2008/0198666 | A1 | 8/2008 | Nygren |
| 2010/0264869 | A1 | 10/2010 | Dubovsky |
| 2011/0050188 | A1 | 3/2011 | Wang et al. |
| 2011/0084557 | A1 | 4/2011 | Ger et al. |
| 2011/0218692 | A1 * | 9/2011 | Li ..................... G06F 1/28 700/297 |
| 2012/0249250 | A1 * | 10/2012 | Cheng ................ H03B 27/00 331/45 |
| 2012/0293021 | A1 | 11/2012 | Teggatz et al. |
| 2013/0049715 | A1 | 2/2013 | Groom et al. |
| 2013/0078939 | A1 | 3/2013 | Hou |
| 2013/0083578 | A1 | 4/2013 | Kotowski et al. |
| 2013/0154372 | A1 | 6/2013 | Chang et al. |
| 2013/0155739 | A1 | 6/2013 | Itako |
| 2014/0103894 | A1 * | 4/2014 | McJimsey ............ G05F 1/67 323/282 |
| 2014/0300343 | A1 * | 10/2014 | Diewald .............. G01R 21/06 324/103 R |
| 2014/0327457 | A1 * | 11/2014 | Diewald .............. G01R 21/133 324/713 |

OTHER PUBLICATIONS

Chetti P. Proektrovanie klyuchevykh istochnikov elektropitaniya. Moskva, Energoatomizdat, 1990, p. 162-164.

* cited by examiner

ELECTRONIC DEVICE AND METHOD FOR TRACKING ENERGY CONSUMPTION

CROSS-REFERENCE TO RELATED APPLICATION

This application is a continuation of U.S. patent application Ser. No. 14/868,130, filed Sep. 28, 2015, which is a continuation of U.S. patent application Ser. No. 13/788,941, filed Mar. 7, 2013, both are incorporated herein by reference in their entirety.

FIELD OF THE INVENTION

The invention relates to an electronic device and a method for tracking the energy consumption, and more specifically to an electronic device and a method for determining energy consumption using the principle of storing energy in an inductor and transferring the energy into output energy storing components.

The present application relates to jointly owned U.S. Patent Application corresponding to application Ser. No. 13/329,073 entitled, "Electronic Device and Method for Power Measurement."

BACKGROUND

Reducing energy consumption is important in the development and improvement of electronic devices, in particular if they are mobile or portable electronic devices. In order to save energy, electronic devices are more and more controlled by sophisticated schemes in which the magnitude of the consumed currents varies over several decades of magnitude. In low power modes some hundreds of nA (nano-amperes) of a current may be consumed while other operation modes require up to several hundreds of mA (milli-amperes). It is often necessary to measure these currents over a wide range (e.g. from nano-amperes to milli-amperes) with an acceptable accuracy while at the same time being able to track highly dynamic current changes. Furthermore, any side effects due to measuring the consumed energy should be avoided or well controlled. For example, it is preferred that an increase of the energy consumption due to the energy measurement itself not occur.

One of the most common techniques for measuring a current is a measurement using a shunt device or a shunt resister. Using a shunt device for the power measurement requires very high precision analogue to digital converters in order to cover the full dynamic range of the possible magnitudes of the currents. For example, when four and a half decades of measurement with one percent precision is required, a 24-Bit-converter would be required. Furthermore, shunt devices generate a voltage drop. This voltage should be compensated, while the compensation circuitry constitutes a potential source of errors. Direct load compensation can be difficult. This means that the measurement range and therefore the circuitry used for measuring the power consumption has to be adapted during the energy measurement procedure. This increases complexity and entails more potential errors.

Still further, measuring a current indirectly by measuring the voltage across a shunt device requires an initial voltage change on the target. If a buffer capacitor is coupled to the target side (output side of an energy transfer circuits), the buffer capacitor delivers current immediately and needs to be recharged. This behavior affects the true current response of the device under test. Another approach of measuring the energy consumption employs a current mirror. One side of the current mirror delivers the current to the target including the target capacitor. The other side of the current mirror is coupled to an Ampere meter to which the mirrored current is fed. This approach has the advantage that the distortion caused by the target capacitor is minimized. However, the required pairing of the power and sense field effect transistors (FET) is rather poor and is not capable of tracking the huge current magnitude to be supported.

SUMMARY

It is an object of the invention to provide an electronic device and a method for measuring energy consumption in an energy consuming system that covers a large range of magnitudes of supply currents, high dynamic current changes and does not affect the basic functionality of the circuit which energy consumption is measured. According to an aspect of the invention, an electronic device is provided that comprises a switched mode energy tracking circuitry. The switched mode circuit comprises one of more switching elements, one or more in inductors and a compare circuit that controls the output voltage level to be at the selected voltage level. The switching element is configured to switch a current through the inductor and the switch may be a transistor. The voltage compare circuit may be an error amplifier, a voltage comparator, or an A/D converter which conversion result is compared to a reference data. The control block is configured to control the ON-time and OFF-time of the switching element in order to transfer energy form a primary energy source, e.g. power supply, to the output of the energy tracking system and to control the level of the output voltage. The electronic device further comprises a control logic stage, error detection and reporting block, and an accumulator of the individual ON-time events.

The control logic stage generates the switching signals SW1 to SWi for the switched transistors in the form of ON-time pulses with a constant ON-time. The control logic state also controls the OFF-time which is used also as an indicator if the energy in the inductor is transferred to the output respectively of a capacitor. The voltage-compare circuit flags when the next ON-time pulse has to be generated. If the OFF-time is not over before the next ON-time is triggered the system reports an error condition. An error conditions is also reported if the output voltage VL is not within predefined limits.

The switching signals are formed according to a pulse density scheme. The highest density of pulses occurs when the On-time and OFF-time are met at the time another ON-time is requested. Higher density is enabled by default or by control information e.g. a control bit and this is handled by the control circuit as described previously. In an embodiment of the invention, the pulse accumulator can be in the simplest implementation a digital counter. The counter in this embodiment is then configured to count the number of ON-time pulses for determining the consumed power based on the number of ON-time pulses per time. The constant pulse width of the ON-time pulses makes the influence of the system components such as the non-linear behavior of switched transistors or inductors negligible. The target voltage offset at the output of the energy tracking system is highly reduced. A wide range of magnitudes of the measured current can be covered.

According to another aspect of the invention, the electronic device comprises a first capacitor C1 coupled to the input of the energy tracking system and a second capacitor C2 coupled to the output of the energy tracking system. The ON-time of the switching element in conjunction with the inductor's value and the value of the capacitor C1 is configured to keep the voltage within the system accuracy requirements. The output capacitor C2 is of such value that the voltage increase during transferring the energy from the inductor IND1 to INDi is within the accuracy expectations.

The energy tracking system of this embodiment is contrary to a pulse width modulation scheme and all energy in the inductor can be transferred to the output respectively to output capacitor C2. The frequency of the ON-time pulses is proportional to and practically a linear function of the consumed current. During a settled operation condition, in which the input and output voltages and the charges on the input and output capacitors have settled, each ON-time pulse of the switched transfers about the same amount of the energy.

According to an embodiment of the invention, a reference impedance or a reference resistor can be coupled to the output of the energy tracking system in order to make a reference energy measurement. The results of the reference measurement(s) can then be used for calibrating the system to the energy consumption. Therefore, the number of the ON-time pulses can be used for determining the energy consumption during normal operation even with an unknown load. The unknown load according to an embodiment of the invention can be an electronic device.

In an embodiment of the invention, the electronic device comprises an energy tracking system with a switching component, an inductor and a transfer support diode or switch. The switching component can then be configured to enable a current through the inductor and to stop further current flow from the input energy source, such as a power supply, battery etc. The voltage compare circuit can be an error comparator or error amplifier. The voltage compare circuit is configured to send a signal to the control circuit and the ON-time generator so that the switching component can be triggered or be prepared to be triggered. The error compare circuit serves to deliver the demand on energy to maintain a stable output voltage. The generation and frequency of the ON-time pulses can be controlled in response to a change of the output voltage. The ON-time pulses can be combined with a time stamp on an individual basis or on a group of pulses.

Another embodiment of the invention includes ON-time pulses that are based on a defined time and the difference to that defined time base is bounded by pulses or a group of pulses. The energy consumption may then be determined based on the number of the ON-time pulses per considered time period.

In an aspect of the invention, the energy consumption may then be derived from a phase variation of the ON-time pulses. This aspect allows a quick evaluation of changes of the power consumption. The energy transfer during ON-time pulses usually is significantly smaller than the energy stored on a first capacitor C1 coupled to the input of the energy transfer system. The energy withdrawn from the energy source at the input of the energy transfer system influences the energy transferred during the ON-time. The influence of the energy sourcing capability is a factor in the calibration cycle.

The energy stored on a second capacitor C2 coupled to the output of the energy transfer system is also significantly larger than the energy stored in the inductor during the ON-time and transferred to the output and the capacitor C2 during OFF-time. The energy consumption may be calibrated by coupling one or more reference impedances to the output of the energy transfer system. The result of the calibration may then be used for normalizing the energy consumption during normal operation. During normal operation a target device or a device under test (DUT) is then coupled to the output of the energy transfer system instead of the reference impedance. However, in another embodiment, the reference impedance may be coupled to the output while the target load device or DUT is still coupled to the output of the switched mode power converter. The energy of one or a group of ON-time pulses due to the additional load of the reference load can be evaluated for calibrating the power measurement based on the energy pulse ON-time and OFF-time conditions.

PRIOR ART

Figure 2:
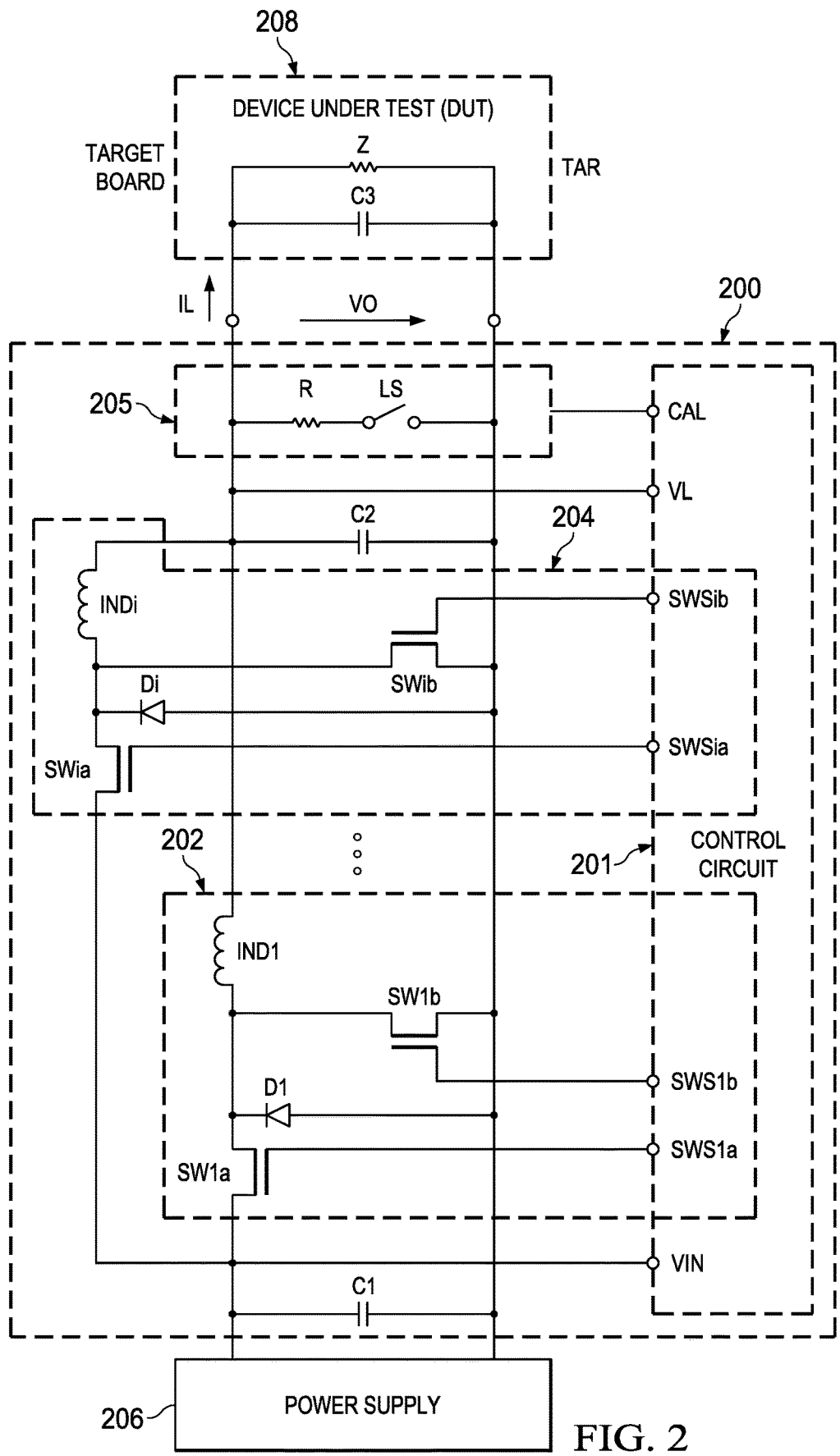

FIG. 2 is a simplified circuit diagram of an embodiment of the invention.

Figure 3:
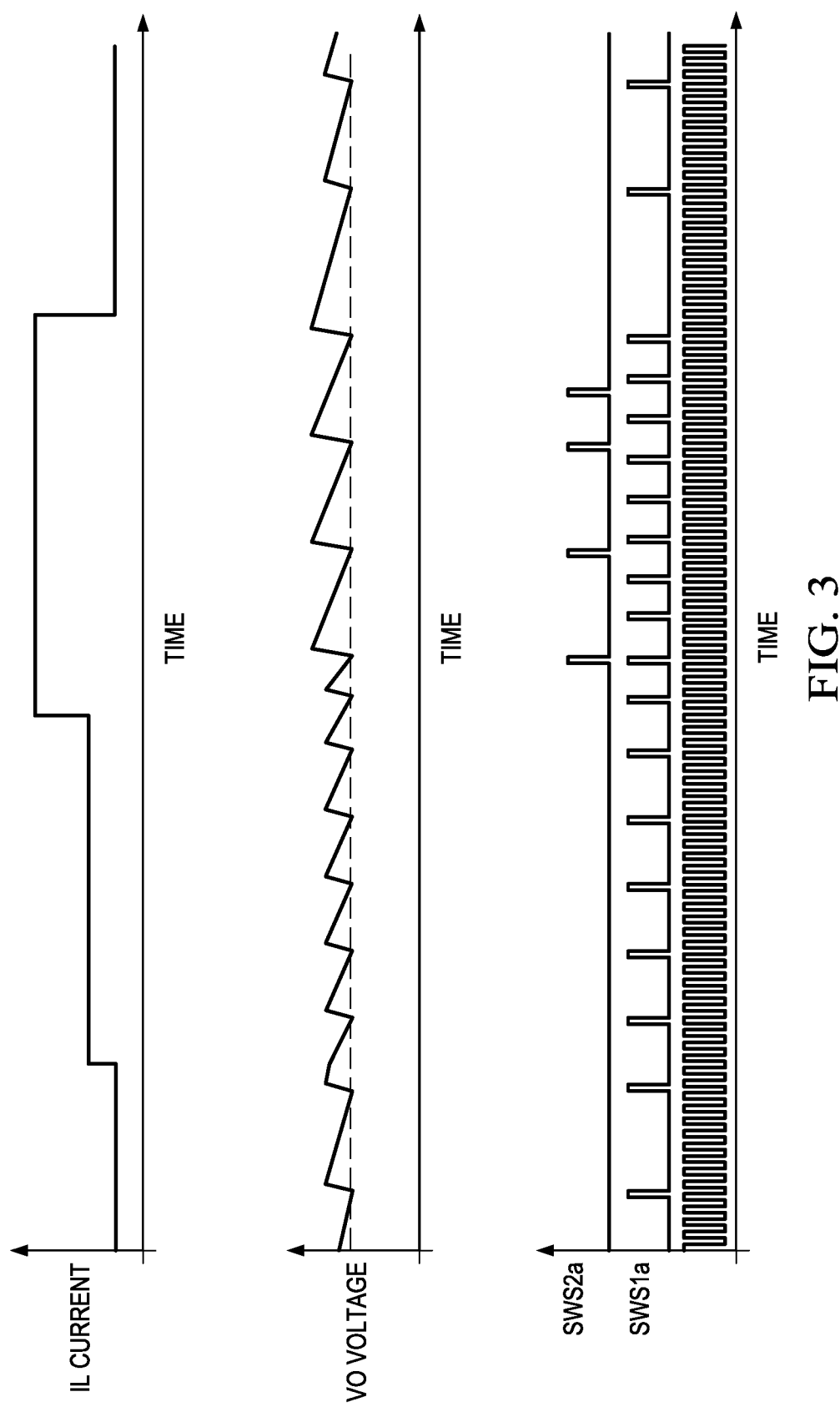

FIG. 3 is a diagram showing waveforms of signals of the circuit shown in FIG. 2 according to an embodiment of the invention.

Figure 4:
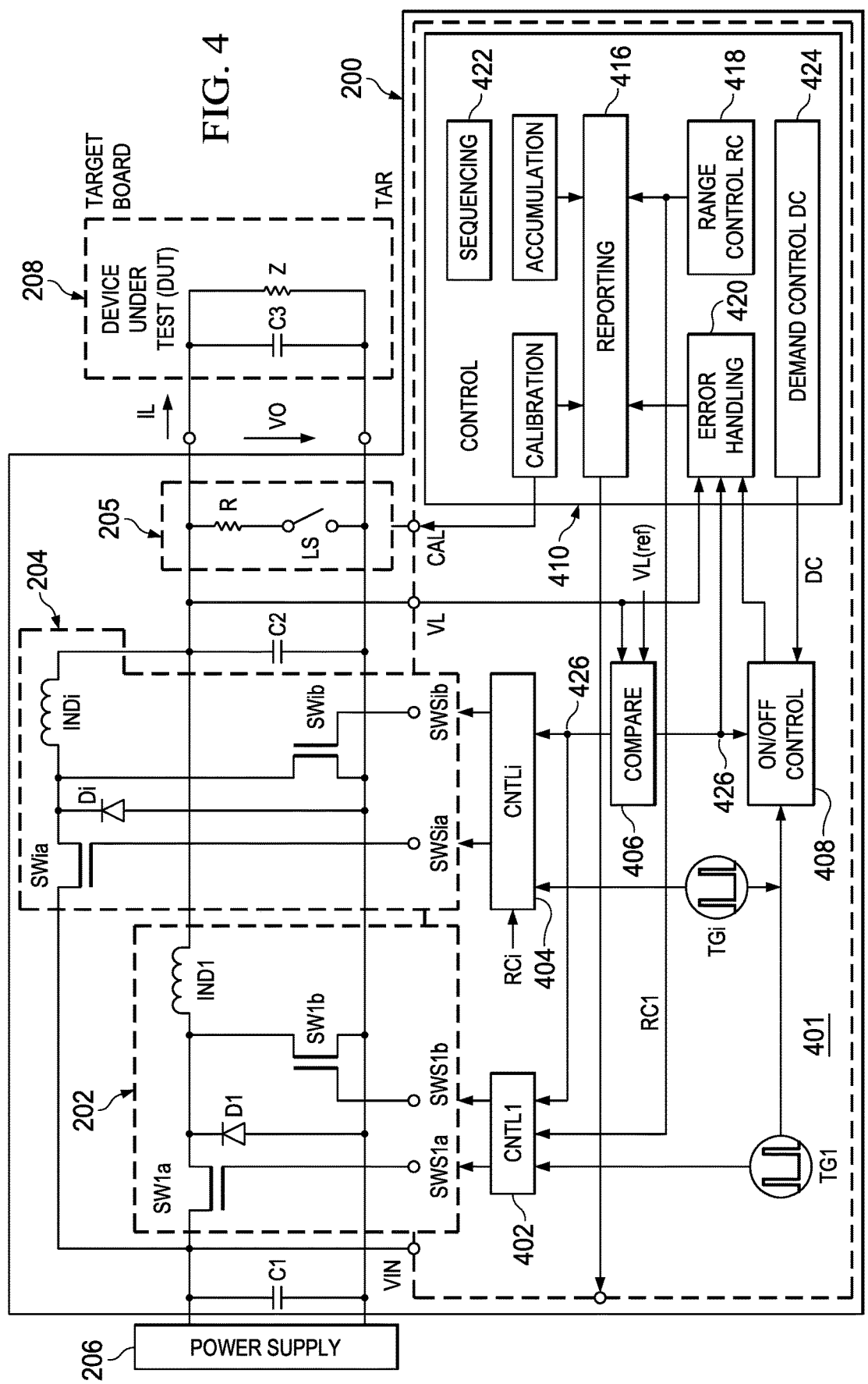

FIG. 4 is a circuit diagram of an embodiment of the invention.

DETAILED DESCRIPTION OF EXAMPLE EMBODIMENTS

Figure 1:
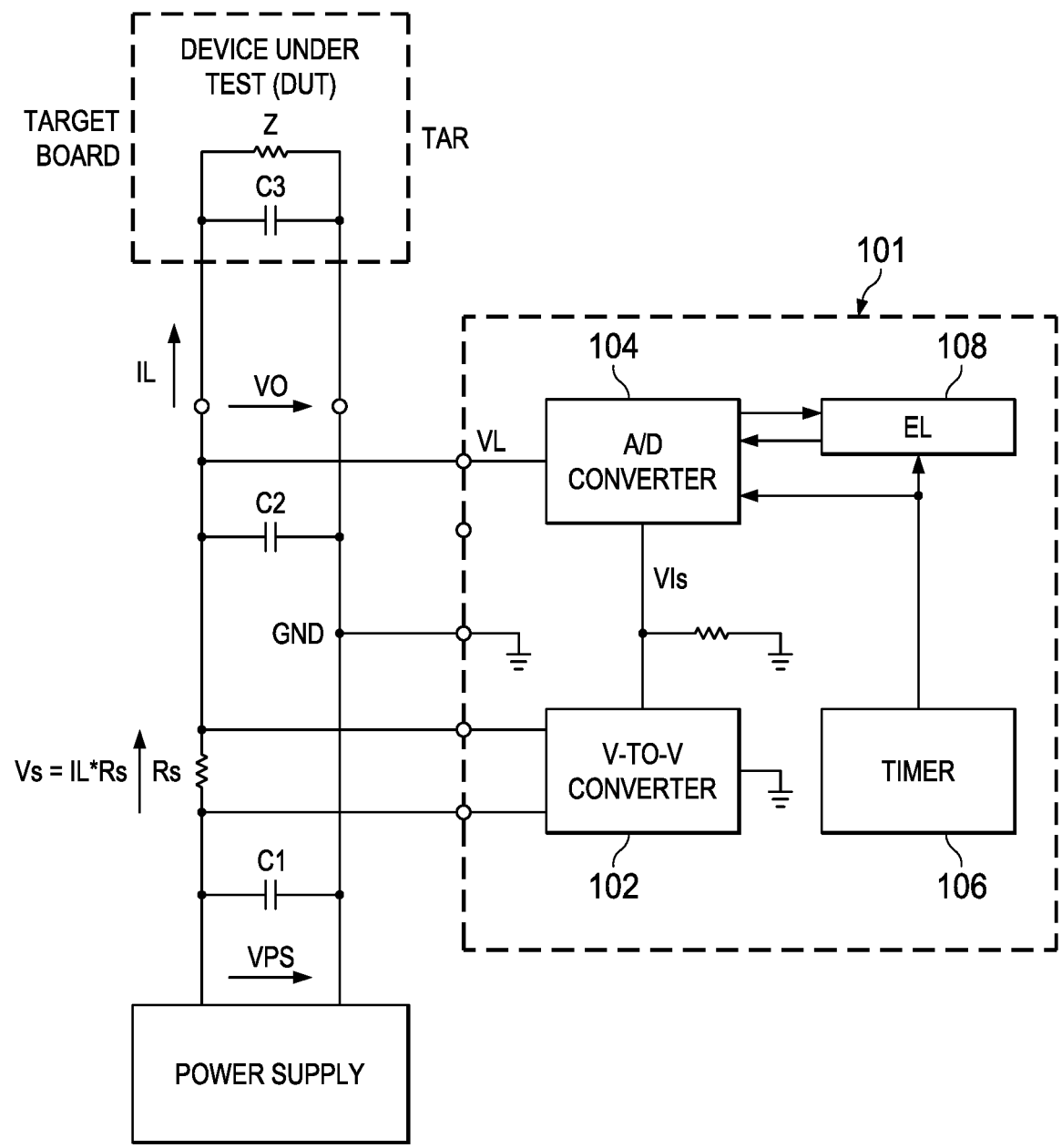
FIG. 1 shows a circuit measuring the current, the voltage and the timing relations to calculate the energy consumed within the load of the device-under-test.

FIG. 1 shows a circuit 101 that measures the load current via a voltage-to-voltage converter 102, an A/D converter 104 and timer 106. The energy EL used by the load is calculated in block EL 108. The voltage VL is measured via the A/D converter 104. When the A/D converter 104 is used for sequential conversions, phase related errors may occur. A timer 106 is used to create the time base t(b) for the A/D converter 104. The energy EL used by the load (i.e. DUT) is calculated by the block EL according to equation 1 below.

$$EL=IL*VL*t(b) \qquad \text{Equation1}$$

FIG. 2 shows a simplified diagram of an embodiment of the invention. In this embodiment, an energy tracking system 200 comprises energy transfer blocks 202 and 204, a control circuit 201 and reference impedance 205. In this embodiment, each energy transfer block 202 and 204 comprises two switched transistors, a diode and an inductor. For example, energy transfer block 202 comprises switched transistors SW1$a$ and SW1$b$, diode D1, and inductor IND1. In this example two energy transfer blocks 202 and 204 are shown. However, more than two energy transfer blocks may be used. Each inductor in an energy transfer block is coupled with one side to a first switched transistor and with the other side of the inductor to an output of the energy transfer block. The switched transistors can be referred to as energizing switches. The diodes may be replaced or complemented by a second switch. The control circuit 201 controls the energy switches SWS1$a$, SWS1$b$, SWSi$a$ and SWSi$b$. The control circuit 201 will be explained in more detail later in the specification.

FIG. 3 shows the timing diagram for an energy transfer circuit that has two transfer paths. The first path has SW1$a$, IND1, D1, and the ON-time signal applied to SWS1$a$. The second switch SWS1$b$ shown in energy transfer block 202, in this example, is not used. The second path (2=i) has SWi$a$, INDi, Di, and the ON-time signal applied to SWSia. The second switch SWSib shown in energy transfer block 204, in this example, is not used. The two energy transfer paths are used mainly to enhance the dynamic range of delivering energy. The second switches SWS1B and SWSib are used (or switched in parallel) when the load conditions are higher than the first path can serve. The system may have even more than 2 paths enabling further spread of the dynamic range.

FIG. 4 shows more detail in the control circuit 201. The compare circuit 406 is coupled to receive an external reference signal VL(ref) for determining a deviation of the output voltage VL. The output of the compare circuit is coupled to the control logic stage CNTL1 402 and CNTLi 404. The ON-time and OFF-time generator 408 is coupled to feed the ON-time signals TG1 and TGi to the control logic CNTL1 and CNTLi respectively. The control logic stage CNTL1 provides switching signals SWS1*a* and SWS1*b* with constant ON-time pulses for switching the switching element SW1*a* and SW1*b*. The control logic stage CNTLi provides switching signals SWS1*ia* and SWSib with constant ON-time pulses for switching the switching element SWia and SWib.

Issuing the next ON-time pulses is a function of the output signal 426 of the compare circuit 406 and the OFF-time. The constant ON-time is generated in this embodiment from constant clock CLK (e.g. from a crystal oscillator). Such an implementation eases the calibration situation since the ON-time is nearly independent of the voltage and temperature conditions. The primary side of the energy tracking system is coupled to a first capacitor C1. Accordingly, one side of the switching elements SW1*a*, SWia is coupled to one side of the first capacitor C1. The other side of the first capacitor C1 is coupled to ground. The primary side of the energy tracking system is supplied by a regulated providing power supply 206. The output or secondary side of the energy tracking system is coupled to a second capacitor C2 for buffering the output voltage VO. A target board or device under test 208 can be coupled to the output of the energy tracking system. The current consumed by the target board or device under test is the load current IL. The level of the output voltage is VO.

One or more reference impedances 205 in the form of reference resistor R and a switch LS can be coupled through switch LS to the energy tracking system. Instead of the target board the reference resistor R can be switched to the output VO. However, the target board or DUT may still be coupled to the output during the reference measurement. The result of the reference measurement with the well characterized reference resistor can then be used to calibrate the measurement for the operation with the unknown load of the target board. The energy transferred through the switched transistor SW1, SWi during an ON-time pulse is usually much smaller than the stored on the capacitors C1 and C2. If the energy that is transferred during an ON-time pulse is ESW, and the energy on capacitor C1 is EC1, and the energy on capacitor C2 is EC2, the following advantageous ratios are adventurous:

$ESW = k1 * EC1$ and $ESW = k2 * CHC2$ with $k1$ and $k2 > 50$.

ESW is much smaller than EC2 and EC1. When the output voltage VO has settled, the compare block measures any deviation of target output voltage VL and versus VL(ref). The control block CNTL1 and CNTLi increase or decrease the density of ON-time pulses. The ON-time pulses are generated with a constant ON-time and a minimum OFF-time. The inductors IND1 and INDi will be charged with a certain amount of energy from the first capacitor C1. During the OFF-time the energy in the inductors is transferred to the second capacitor C2. In an embodiment of the invention, the first capacitor C1 and the second capacitor C2 are sized such that this energy transfer does not significantly change the voltages across the first capacitor C1 and the second capacitor C2.

As long as the energy in the second capacitor C2 is sufficient to maintain the output voltage VO, the compare block will not request another ON-time pulse through switching signal SWS1*a*, SWS1*b* or SWSia, SWSib. However, if a certain load current IL is consumed by the target board or DUT, the voltage across the second capacitor C2 is reduced until the voltage compare block VL=VL(ref) determines that the output voltage VO at output node OUT is lower than defined and generates a request signal to CNTL1 and CNTLi. Another ON-time pulse will then be generated. During normal operation, this causes a pulse density of ON-time pulses of signal SWS that is proportional to the consumed energy of the DUT/target board 208. In another embodiment, the number of ON-time pulses per time counted by the accumulator and the current data there reflects and indicates the energy consumption. Under stable input and output voltage conditions, each ON-time pulse represents the same amount of energy that is transferred during each ON-time pulse. The OFF-time variations of the ON-time pulses of the switching signal SWS also indicate current variations of the load currents IL.

A reference measurement on the known reference resistor R can be used for normalizing the measured current. The reference resistors R may be switched on through switch LS in addition to the target board 208. The influence of the reference resistor R on the OFF-time in signal SWSx can then be evaluated. However, the achieved result can be improved if the reference resistors R are switched on while the target board is not connected.

FIG. 3 shows a diagram with waveforms of the load current IL, the output voltage VO, and ON-time signals as applied to switches SW1*a* and SWS2*a*. The load current IL of the target or DUT increases at a certain point of time. The voltage VO at the output node OUT varies according to a saw tooth scheme around the target output voltage level. The pulse density of the ON-time pulses SWS1*a* and SWS2*a* increases at a certain point of time or starts (SWS2*a*) depending on the extent of the load current IL. The voltage VO varies according to a saw tooth scheme around the target output voltage level (dashed line). The pulse density of the ON-time pulses increases after the load•current IL Increases. This change in density of ON-time pulses of both paths is evaluated.

Although the invention has been described hereinabove with reference to a specific embodiments, It is not limited to these embodiment and no doubt further alternatives will occur to the skilled person that lie within the scope of the invention as claimed.

The invention claimed is:
1. A circuit comprising:
 a switch having first and second terminals, the switch's first terminal and the switch's second terminal adapted to be coupled to a device under test;

a capacitor having first and second terminals, the capacitor's first terminal coupled to the switch's first terminal and the capacitor's second terminal coupled to the switch's second terminal;

an inductor having first and second terminals, the inductor's first terminal is coupled to the capacitor's first terminal;

a transistor having a control terminal, a first channel terminal, and a second channel terminal, the transistor's first channel terminal coupled to the inductor's second terminal and the transistor's second terminal is coupled to the switch's second terminal.

2. The circuit of claim 1, further comprising a control circuit that is coupled to the transistor's control terminal, the control circuit comprises:

an ON-time generator;

a control logic block coupled to the on-time generator and configured to generate signals for the transistor's control terminal, the signals having ON-time pulses; and an accumulator coupled to the control logic block and configured to collect the number of ON-time pulses.

3. The circuit of claim 1, further comprising a resistor coupled between the switch's first terminal and the capacitor's first terminal.

4. The circuit of claim 1, further comprising a diode having an anode terminal and a cathode terminal, the diode's anode terminal coupled to the transistor's second terminal and the diode's cathode terminal coupled to the transistor's first terminal.

5. The circuit of claim 1, further comprising a second switch having a control terminal, a first channel terminal, and a second channel terminal, the second switch's first channel terminal is coupled to the inductor's second terminal and the second switch's second terminal is adapted to be coupled to an input voltage source.

6. The circuit of claim 4, wherein the second transistor's control terminal is adapted to be coupled to a control circuit.

7. The circuit of claim 1, where the transistor's control terminal is adapted to be coupled to a control circuit.

8. The circuit of claim 1, wherein the transistor's second channel terminal is adapted to be coupled to a power supply.

9. The circuit of claim 1, wherein the capacitor's first terminal is adapted to be coupled to a power supply.

* * * * *